United States Patent [19]

Anderson et al.

[11] Patent Number: 5,073,683
[45] Date of Patent: Dec. 17, 1991

[54] EDGE REPAIR AND REINFORCEMENT OF FLEXIBLE FLAT CABLES

[75] Inventors: Edward A. Anderson, Yorba Linda; Ernesto S. Sandi, Perris; Mary K. White, Los Angeles, all of Calif.

[73] Assignee: Hughes Aircraft Company, Los Angeles, Calif.

[21] Appl. No.: 541,664

[22] Filed: Jun. 21, 1990

[51] Int. Cl.⁵ .............................. H01B 7/08
[52] U.S. Cl. .................. 174/117 FF; 29/402.01; 29/402.14; 29/402.18; 156/88; 174/117 A
[58] Field of Search ......... 174/117 F, 117 FF, 117 R, 174/117 PC, 117 A, 119 R; 156/88; 428/192; 29/402.01, 402.09, 402.14, 402.18

[56] References Cited

U.S. PATENT DOCUMENTS

| | | | |
|---|---|---|---|
| 3,387,248 | 6/1968 | Rees | 174/117 R |
| 4,812,135 | 3/1989 | Smith | 174/117 F X |
| 4,832,621 | 5/1989 | Asai et al. | 174/117 FF X |

FOREIGN PATENT DOCUMENTS 2027553 2/1980 United Kingdom .
2120837 12/1983 United Kingdom .

Primary Examiner—Morris H. Nimmo
Attorney, Agent, or Firm—William J. Streeter; Wanda K. Denson-Low

[57] ABSTRACT

A previously fabricated flat flexible cable (10) includes tears and/or micro-fissures, micro-cuts or other defects or imperfections, depicted by jagged or wavy lines (16), in its edges (18). A multi-fiber tread (20), placed at the cable's edges, is enclosed within, between and/or atop one or more layers of adhesive film (22). A bond material (26) bonds the film layers to themselves at their ends (28), to the cable respectively at its sides (24), and to the thread. The bond material is also bonded to and within the micro-fissures, micro-cuts or other defects for repair thereof. The bond material also bonds thread (20) to portions of the cable adjacent to the tear to prevent further propagation of the tear into the cable.

12 Claims, 2 Drawing Sheets

EDGE REPAIR AND REINFORCEMENT OF FLEXIBLE FLAT CABLES

BACKGROUND OF THE INVENTION

The present invention relates to flat cables and, more particularly, to repair and reinforcement of already fabricated flexible flat cables.

Flexible flat cables are subject to tearing which will propagate from their edges and to and through the conductors. Such tearing can occur during handling, assembly and use of the cable, and originates at micro-fissures, micro-cuts, notches or other imperfections existing along the edges of the cable. These imperfections are formed during fabrication of the cable after the copper foil and fabric reinforcements have been laminated into the flat cable preform, when the cable is cut to its final shape by steel rule dies.

Tearing has been a long-known problem, and many solutions have been advanced. One such solution appears in U.S. Pat. No. 4,812,135. There, a thread of Kevlar (trademark of E.I. Du Pont DeNemours & Co.) material is incorporated internally within the flat cable and parallel to the edge of the conductors, at the edges of the flexible circuit strip. By including reinforcing thread members between two layers of the flexible cable, any tears are prevented from growing further into the cable past the reinforcing thread members. That disclosure also describes an alternative embodiment in which the reinforcing thread is placed internally of the layers during manufacture, and is bonded to the outer surface of one layer of a cable.

Such a design has some disadvantages. It is not amenable to ready made and/or designed cables, which require high pressure when laminated. Placing the reinforcing thread within such an already fabricated cable is virtually impossible. This design is also not amenable to selective use, that is, it may not be necessary to utilize a reinforcing thread for all designs, but only for selected designs where reinforcement is needed. Most importantly, while that solution recognizes the problems of tears, it does not cure the defect or imperfection; it merely uses a reinforcing thread to prevent further propagation of the tear through the cable.

SUMMARY OF THE INVENTION

These and other deficiencies are addressed in the present invention by placing a strength member adjacent to each edge of an already fabricated flat cable and bonding the strength member to the cable edge by a bonding agent while, at the same time, filling and thus repairing any micro-fissures, micro cuts or other imperfections which may exist in the cable edge by the bonding agent. Any tears in the cable are secured together by the strength member and the bonding agent to prevent propagation of the tear further into the cable.

Several advantages are derived from this arrangement. Tearing of flat cables is virtually eliminated or further prevented, without detracting from the flexibility and thickness of the cable. Existing cables may be reinforced wherever desired at specific points or entirely along their length, without needing to change the process of making the cable. The resistance to tear may also be adjusted.

Other aims and advantages, as well as a more complete understanding of the present invention, will appear from the following explanation of exemplary embodiments and the accompanying drawings thereof.

DETAILED DESCRIPTION OF THE PREFERRED EMBODIMENTS

Figure 1:
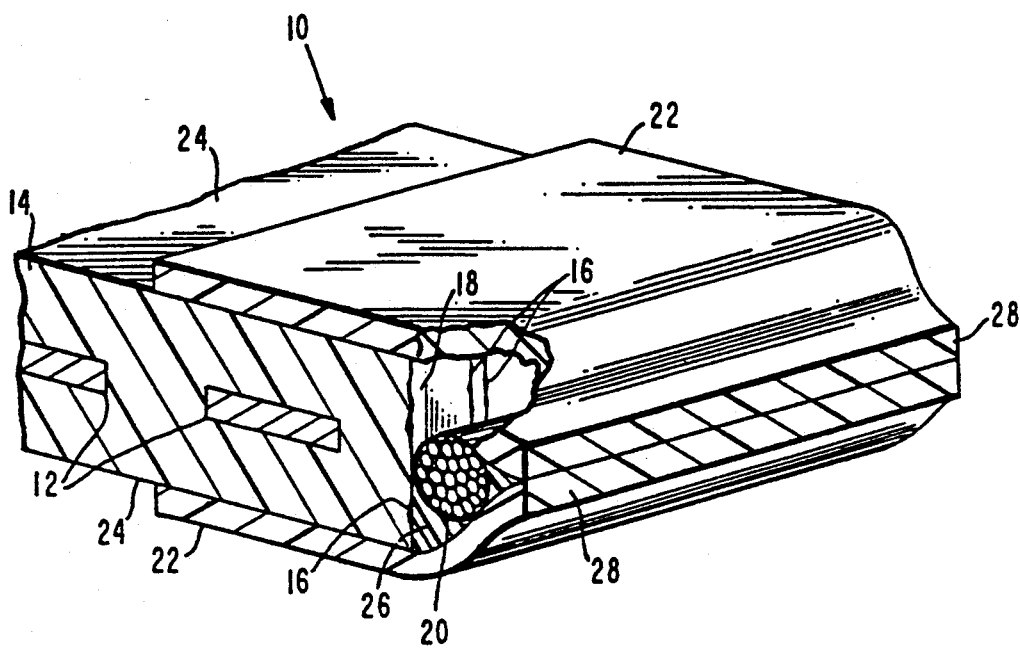
FIG. 1 is a perspective view, in cross-section, of a previously fabricated flat flexible cable which has micro-fissures, micro cuts or imperfections in one or both of its edges, and which, by the present invention, is repaired and reinforced. A multi-fiber thread, placed at the cable's edge, is enclosed within a pair of film adhesive layers. A bond material bonds the film layers to themselves at their ends, to the cable respectively at its sides, and to the thread. The bond material is also bonded to and within the micro fissures, micro cuts or other imperfections for their repair. For purposes of illustration, the bond material is shown only in the bottom portion of FIG. 1; it is omitted in the upper portion to reveal several jagged imperfections denoted by jagged lines 16.

As shown in FIG. 1, a flat cable 10 comprises a plurality of conductors 12 embedded within a dielectric material 14, and is of conventional construction, having been fabricated by known techniques. Cable 10 may comprise a single cable or a multiplicity of flat cables secured together in any conventional manner. In a typical construction of cable 10, a final step includes the step of cutting or trimming its edges to its final shape by a steel rule die. Such a die leaves minute notches, micro fissures, micro cuts, or other imperfections, generally denoted by jagged lines 16, at a side edge 18 of the cable. These imperfections 16 typically form the site or sites for one or more tears in the cable during its assembly, use or handling. The elimination of these sites and the strengthening of the cable at its edge is an aim of the present invention. Where a tear has already begun, for example, from the site of an imperfection, the present invention can prevent further propagation of the tear into the cable.

Such elimination or avoidance of these sites or the continued tearing of an existing tear is provided first by a thread or strength member which is resistant to breaking through cuts or tensile forces exerted thereon. Examples of such threads include Dacron and Kevlar (an aromatic polyamide fiber) synthetic fibers, both trademarks of E.I. Du Pont DeNemours & Co. Thread 20 may be a single thread, but preferably comprises a multi-stranded twisted thread to provide a greater resistivity to cutting and breaking under tension. As shown in FIG. 1, thread 20 is placed adjacent edge 18 of cable 10 and is bonded in place. Such bonding preferably comprises a pair of layers 22 of suitable plastic material placed on both top and bottom surfaces or sides 24 of cable 10.

Figure 2:
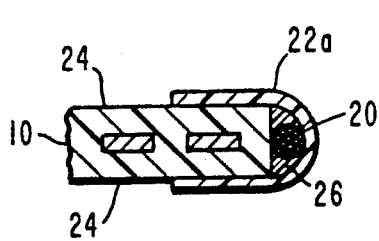
FIGS. 2-11 are views of other reinforcements which embody the concepts of the present invention.
Figure 4:
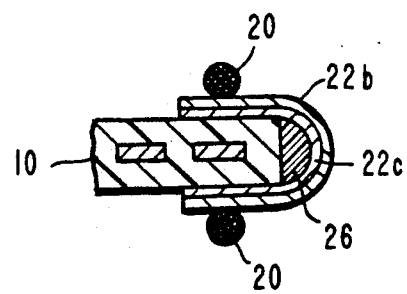
Figure 3:
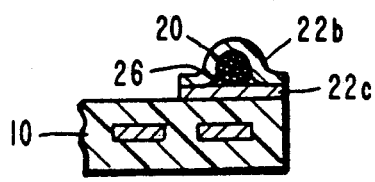
Figure 5:
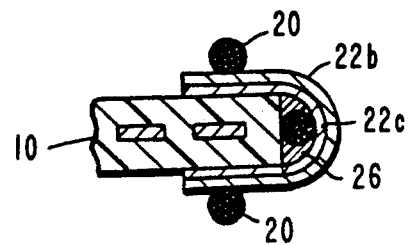
Figure 6:
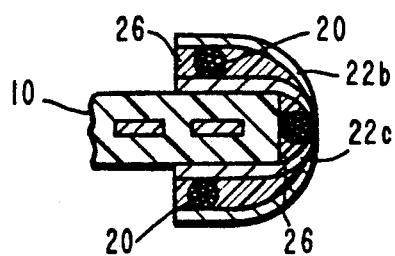
Figure 9:
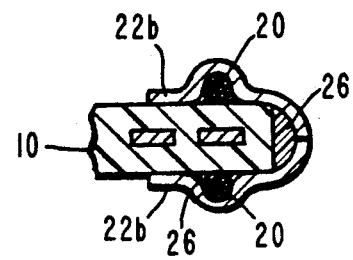
Figure 7:
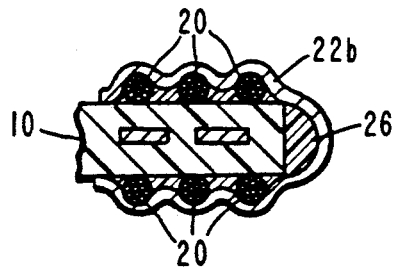
Figure 10:
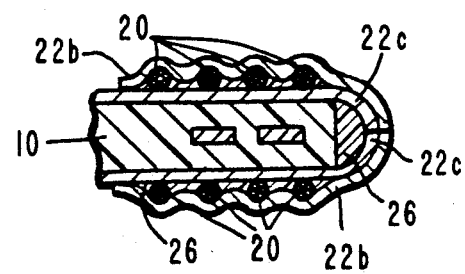
Figure 8:
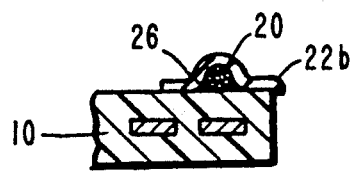
Figure 11:
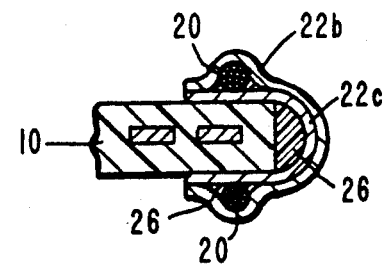

Alternatively, as shown in FIG. 2, a single layer 22a may be wrapped around the cable edge and adhered at its ends to both sides 24 of the cable. A suitable bonding material 26 (see also FIG. 1) bonds layers 22 or layer 22a to cable top and bottom sides 24, to thread 20 and to ends 28 of layers 22. Bonding material 26 further enters within and is bonded to all of the micro-fissures, micro cuts, or imperfections 16 and thereby repairs them and reinforces the cable. Further, the bonding material bonds thread 20 to those portions of the cable which are adjacent to the tears and thereby prevents further propagation of the tears into the cable.

Bond material 26 appropriately bonds the cable, layer and thread assembly together. In FIG. 1, for illustrative purposes only, a portion of bond material 26 is removed above threads 20 so that jagged imperfections 16 may be seen. In reality, material 26 would bond thread 20 also in this upper portion.

Preferably, thread 20 comprises Kevlar fiber or Dacron tubing. Kevlar fiber has been found to be the more successful material. Layers 22 also preferably comprise an adhesive film comprising a mixture of epoxy and nitrile resins with amine curing agents on a polyester mat. Such an adhesive film is manufactured under the designation "FM 123-2", a trademark of the American Cyanamid Company, which by its specification BPT-233A is defined as "a modified nitrile epoxy adhesive film on a polyester mat." This particular adhesive film is preferred because it meets the "out-gassing" requirements necessary for space applications. Where deposits from "out-gassing" or distillation of adhesives is not a concern, other film or other adhesives may be used.

FIGS. 3-11 illustrate other cable reinforcement configurations comprising film adhesive layers generally designated by indicia 22b and 22c and with one or more threads 20 placed within or between or on the outside of layers 22b and 22c.

Although the invention has been described with respect to particular embodiments thereof, it should be realized that various changes and modifications may be made therein without departing from the spirit and scope of the invention.

What is claimed is:

1. A tear resistant flexible flat cable assembly comprising:
   a fully fabricated flat cable having edges in which micro-fissures, micro-cuts or other imperfections exist;
   a strength member positioned adjacent the edges of said fabricated cable; and
   bond material bonding said strength member to said cable edge and filling the micro-fissures, micro-cuts or other imperfections.

2. A tear resistant flexible flat cable assembly according to claim 1 wherein tears exist in the edges of said fabricated cable, in which said strength member is bonded by said bond material to portions of the cable adjacent the tears for preventing further propagation of the tears into the cable.

3. A tear resistant flexible flat cable assembly comprising:
   a fully fabricated flat cable having edges in which micro-fissures, micro-cuts or other imperfections exist;
   a strength member positioned adjacent the edges of said fabricated cable; and
   bond material bonded to said strength member, to said cable edge and within said micro-fissures, micro-cuts or other imperfections for repair thereof.

4. A tear resistant flexible flat cable assembly according to claim 3 wherein tears exist in the edges of said fabricated cable, in which said strength member is bonded by said bond material to portions of the cable adjacent the tears for preventing further propagation of the tears into the cable.

5. A tear resistant flexible flat cable assembly according to claim 3 in which said bond material comprises a pair of layers of adhesive film bonded respectively to themselves at their ends and to said cable at its sides and about said strength member.

6. A tear resistant flexible flat cable assembly according to claim 5 in which each of said adhesive film layers comprises a mixture of epoxy and nitrile resins with amine curing agents on a polyester mat and said strength member comprises a of aromatic polyamide fiber thread.

7. In an already fabricated flexible flat cable having edges and at least two sides, and in which micro-fissures, micro-cuts or other imperfections exist in the edges and provide sites for tears in the cable, the improvement in minimizing and avoiding the occurrence of the tears comprising:
   strength members positioned adjacent the edges of the fabricated cable; and
   a pair of layers of adhesive film bonded by a bonding agent respectively to the cable sides, about said strength member and to themselves, said bonding agent adhering to and within the micro-fissures, micro-cuts or other imperfections for repair thereof.

8. The improvement according to claim 7 in which each of said adhesive film layers comprises a mixture of epoxy and nitrile resins with amine curing agents on a polyester mat and said strength member comprises a thread of Kevlar fabric.

9. A method for minimizing and avoiding the occurrence of tears in an already fabricated flexible flat cable comprising the steps of:
   positioning a strength member adjacent the edges of the fabricated cable for repair of any such tears due to micro-fissures, micro-cuts or other imperfections in the edges; and
   bonding the strength member to the cable edges and within the micro-fissures, microcuts or other imperfections by a bond material.

10. A method according to claim 9 in which said bonding step further comprises the step of bonding the strength member by the bond material to portions of the cable adjacent the tears for preventing further propagation of the tears in to the cable.

11. A method according to claim 9 in which said bonding step comprises the steps of bonding a pair of layers of adhesive film respectively to the cable at its sides and about the strength member and to themselves.

12. A method according to claim 11 in which each of the adhesive film layers comprises a mixture of epoxy and nitrile resins with amine curing agents on a polyester mat and the strength member comprises Kevlar thread.

* * * * *